(12) United States Patent
Yuan

(10) Patent No.: US 11,637,163 B2
(45) Date of Patent: Apr. 25, 2023

(54) ARRAY SUBSTRATE AND MANUFACTURING METHOD THEREOF INCLUDING VIA HOLE TO FACILITATE DEHYDROGENATION, DISPLAY PANEL, AND DISPLAY DEVICE

(71) Applicant: Xiamen Tianma Micro-Electronics Co., Ltd., Xiamen (CN)

(72) Inventor: Yong Yuan, Shanghai (CN)

(73) Assignee: Xiamen Tianma Micro-Electronics Co., Ltd., Xiamen (CN)

(*) Notice: Subject to any disclaimer, the term of this patent is extended or adjusted under 35 U.S.C. 154(b) by 80 days.

(21) Appl. No.: 17/184,599

(22) Filed: Feb. 25, 2021

(65) Prior Publication Data
US 2021/0183976 A1 Jun. 17, 2021

(30) Foreign Application Priority Data
Nov. 25, 2020 (CN) .......................... 202011339928.4

(51) Int. Cl.
*H01L 27/32* (2006.01)
*H01L 51/52* (2006.01)
*H01L 51/56* (2006.01)

(52) U.S. Cl.
CPC ...... *H01L 27/3262* (2013.01); *H01L 27/3265* (2013.01); *H01L 51/5253* (2013.01); *H01L 51/56* (2013.01); *H01L 2227/323* (2013.01)

(58) Field of Classification Search
CPC ............. H01L 27/3262; H01L 27/3265; H01L 2227/323; H01L 51/5253; H01L 51/56
USPC ............................................................ 257/40
See application file for complete search history.

(56) References Cited

U.S. PATENT DOCUMENTS

2016/0307979 A1* 10/2016 Lee .................. H01L 29/66757
2020/0350340 A1* 11/2020 Zhang ................ H01L 27/3262
2021/0249542 A1* 8/2021 Lee .................. H01L 29/78696

* cited by examiner

*Primary Examiner* — Matthew E. Gordon
(74) *Attorney, Agent, or Firm* — Kilpatrick Townsend & Stockton, LLP

(57) ABSTRACT

Provided are an array substrate and a manufacturing method of an array substrate and a display panel and device. The array substrate includes a pixel circuit. The pixel circuit includes a first transistor and a second transistor, the first transistor includes a first active layer, the second transistor includes a second active layer, and the first active layer and the second active layer both include silicon. The array substrate further includes a first-type inorganic layer and a second-type inorganic layer and a first via hole. The first via hole is located above the first active layer and at least penetrates through the second-type inorganic layer. Concentration of hydrogen ions in the first active layer is less than concentration of hydrogen ions in the second active layer.

17 Claims, 12 Drawing Sheets

--Prior Art--

--Prior Art--

--Prior Art--

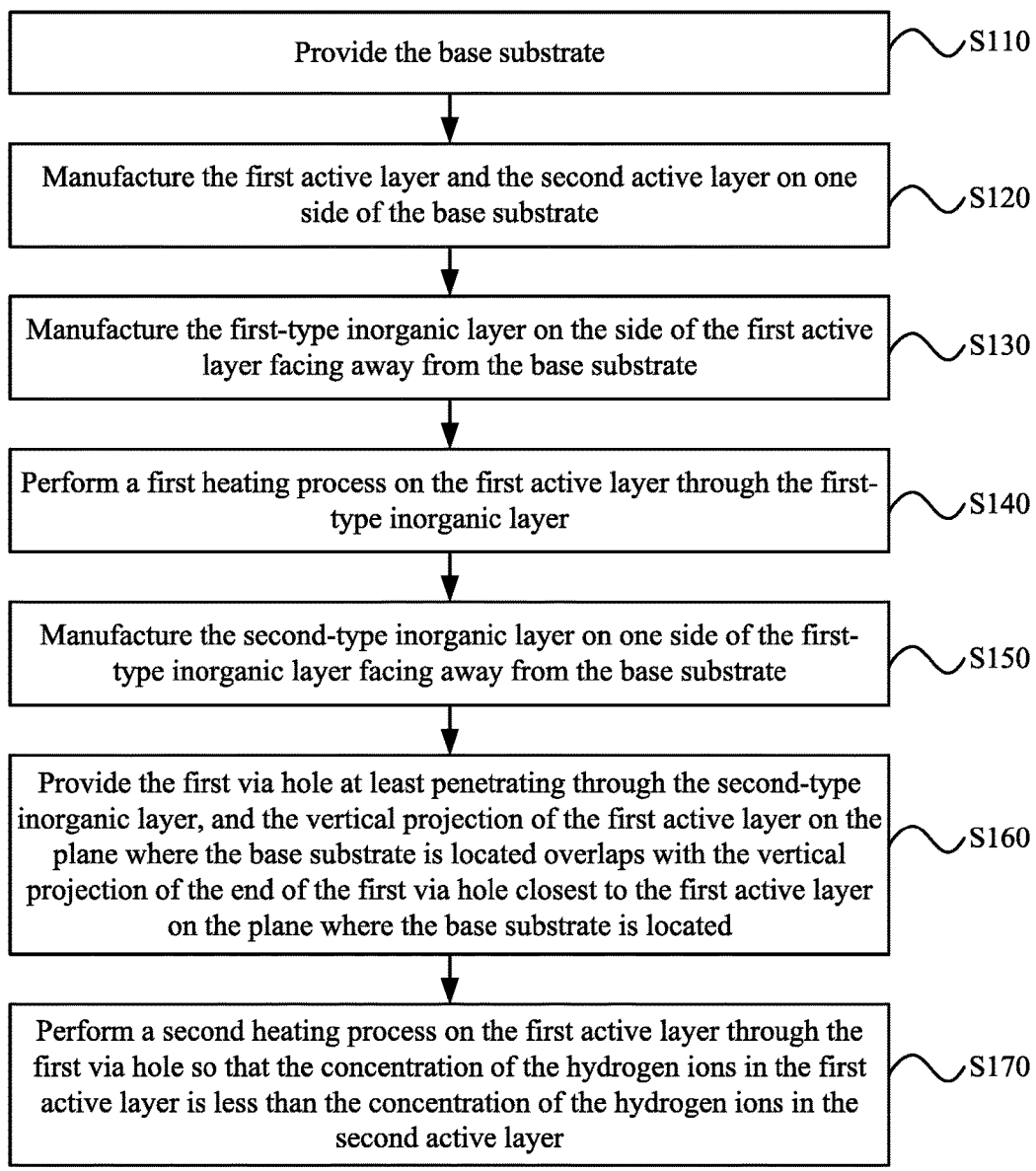
FIG. 10
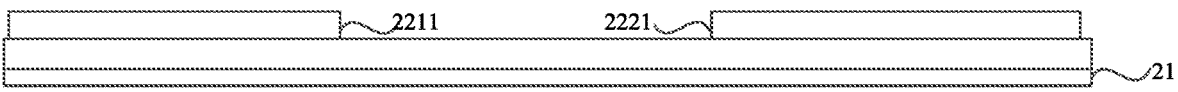
FIG. 11
FIG. 12

ARRAY SUBSTRATE AND MANUFACTURING METHOD THEREOF INCLUDING VIA HOLE TO FACILITATE DEHYDROGENATION, DISPLAY PANEL, AND DISPLAY DEVICE

CROSS-REFERENCES TO RELATED APPLICATIONS

This application claims the priority to a Chinese patent application No. CN 202011339928.4 filed at the CNIPA on Nov. 25, 2020, disclosure of which is incorporated herein by reference in its entirety.

FIELD

Embodiments of the present disclosure relate to the field of display technologies and, in particular, to an array substrate and a manufacturing method thereof, a display panel, and a display device.

BACKGROUND

Organic light-emitting display (OLED) is currently the mainstream technology used for displays such as mobile phones, TVs, and computers. Compared with the conventional liquid crystal display, the organic light-emitting display has the advantages of low energy consumption, low cost, self-luminescence, wide viewing angle, high corresponding speed and the like. Therefore, organic light-emitting display has become a mainstream display technology.

Organic light-emitting display belongs to current-driving display technologies and thus needs to be controlled by a stable current to emit light, and the value and the stability of the drive current of the organic light-emitting display mainly depend on a drive transistor in a pixel circuit of organic light emitting display. Therefore, in the related art, the pixel circuit of the organic light emitting display generally includes a drive transistor and a switch transistor, and the drive transistor and the switch transistor may be the same type of transistor. The drive transistor and the switch transistor of same type are generally manufactured by the same process and have the same characteristics. However, since the drive transistor and the switch transistor need to perform different functions, the drive transistor and the switch transistor manufactured by adopting the same process generally cannot satisfy actual display requirements.

SUMMARY

The present disclosure provides an array substrate and a manufacturing method of an array substrate and a display panel and device. In the present disclosure, a first via hole is additionally disposed on the position of the array substrate corresponding to a drive transistor, and a high-temperature process may be performed merely on an active layer of a first transistor through the first via hole, so that the characteristics of the first transistor are ensured to be good while the turn-off characteristic of the second transistor is ensured to be good, the leakage current is small, and thus the overall characteristics of a pixel circuit are ensured to be good.

One embodiment of the present disclosure provides an array substrate. The array substrate includes a base substrate, a pixel circuit, a first-type inorganic layer and a second-type inorganic layer and a first via hole.

The pixel circuit is disposed on one side of the base substrate. The pixel circuit includes a first transistor and a second transistor, the first transistor includes a first active layer, the second transistor includes a second active layer, and the first active layer and the second active layer both include silicon.

The first-type inorganic layer and the second-type inorganic layer are disposed on one side of the first active layer facing away from the base substrate. The first-type inorganic layer is disposed closer to the first active layer than the second-type inorganic layer.

The first via hole at least penetrates through the second-type inorganic layer, and a vertical projection of the first active layer on a plane where the base substrate is located overlaps with a vertical projection of an end of the first via hole closest to the first active layer on the plane where the base substrate is located.

Concentration of hydrogen ions in the first active layer is less than concentration of hydrogen ions in the second active layer.

The embodiments of the present disclosure further provide a manufacturing method of an array substrate, which is used for manufacturing the array substrate provided by other embodiments. The array substrate includes the pixel circuit, the pixel circuit includes the first transistor and the second transistor, the first transistor includes the first active layer, the second transistor includes the second active layer, and the first active layer and the second active layer both include silicon.

The method includes the steps described below.

The base substrate is provided.

The first active layer and the second active layer are manufactured on one side of the base substrate.

The first-type inorganic layer is manufactured on the side of the first active layer facing away from the base substrate.

A first heating process is performed on the first active layer through the first-type inorganic layer.

The second-type inorganic layer is manufactured on the side of the first-type inorganic layer facing away from the base substrate.

The first via hole at least penetrating through the second-type inorganic layer is provided, and the vertical projection of the first active layer on the plane where the base substrate is located overlaps with the vertical projection of the end of the first via hole closest to the first active layer on the plane where the base substrate is located.

A second heating process is performed on the first active layer through the first via hole so that the concentration of the hydrogen ions in the first active layer is less than the concentration of the hydrogen ions in the second active layer.

The embodiments of the present disclosure further provide a display panel. The display panel includes the array substrate provided in other embodiments.

The embodiments of the present disclosure further provide a display device. The display device includes the display panel provided in other embodiments.

An array substrate provided by the embodiments of the present disclosure includes a pixel circuit, the pixel circuit includes a first transistor and a second transistor, and a first active layer in the first transistor and a second active layer in the second transistor both include silicon. A first via hole is additionally disposed in the array substrate. The first via hole penetrates through at least part of inorganic layers above the first active layer, so that a high-temperature process may be performed merely on the first active layer through the first via hole. In this way, concentration of hydrogen ions in the first active layer is less than concentration of hydrogen ions in the second active layer. Therefore, on the one hand, the performance of the first transistor is ensured to be good; on the other hand, the times of high-temperature processes performed on the second transistor are reduced. Thus, the subthreshold swing of the second transistor is ensured to be relatively small, the turn-off characteristic of the second transistor is ensured to be good, the leakage current of the second transistor is small, the overall operating effect of the pixel circuit is improved, and the overall characteristics of the pixel circuit are ensured to be good.

BRIEF DESCRIPTION OF DRAWINGS

FIG. 10 is a flowchart of a manufacturing method of an array substrate according to an embodiment of the present disclosure;

FIG. 11 to FIG. 17 are diagrams illustrating manufacturing processes corresponding to the manufacturing method provided in FIG. 10;

DETAILED DESCRIPTION

Figure 1:
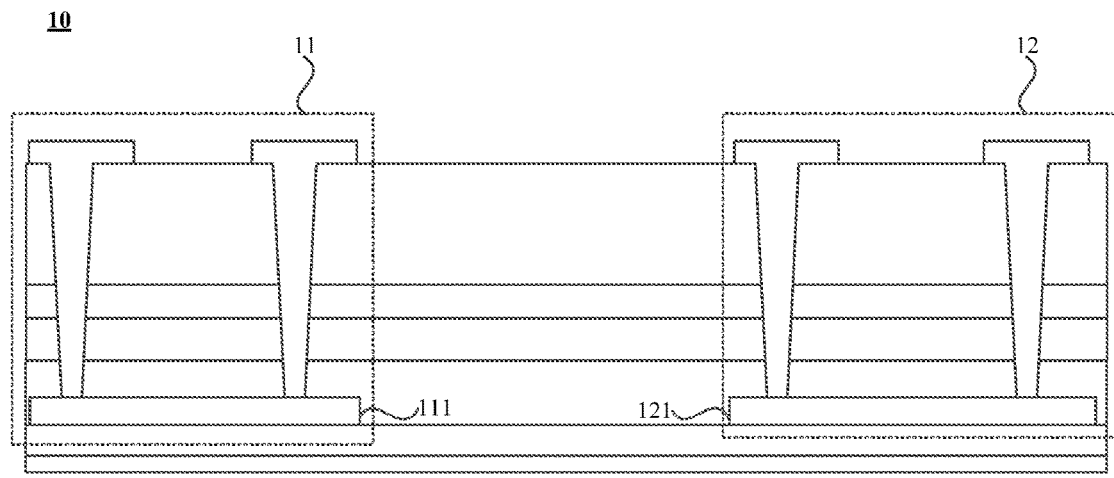
FIG. 1 is a structural diagram of an array substrate in the related art.

The present disclosure is further described below in detail in conjunction with drawings and embodiments. It is to be understood that the embodiments described herein are merely intended to explain the present disclosure and are not to limit the present disclosure. Additionally, it should be noted that for easy of description, only the part related to the present disclosure, instead of all, is illustrated in the drawings.

Figure 2:
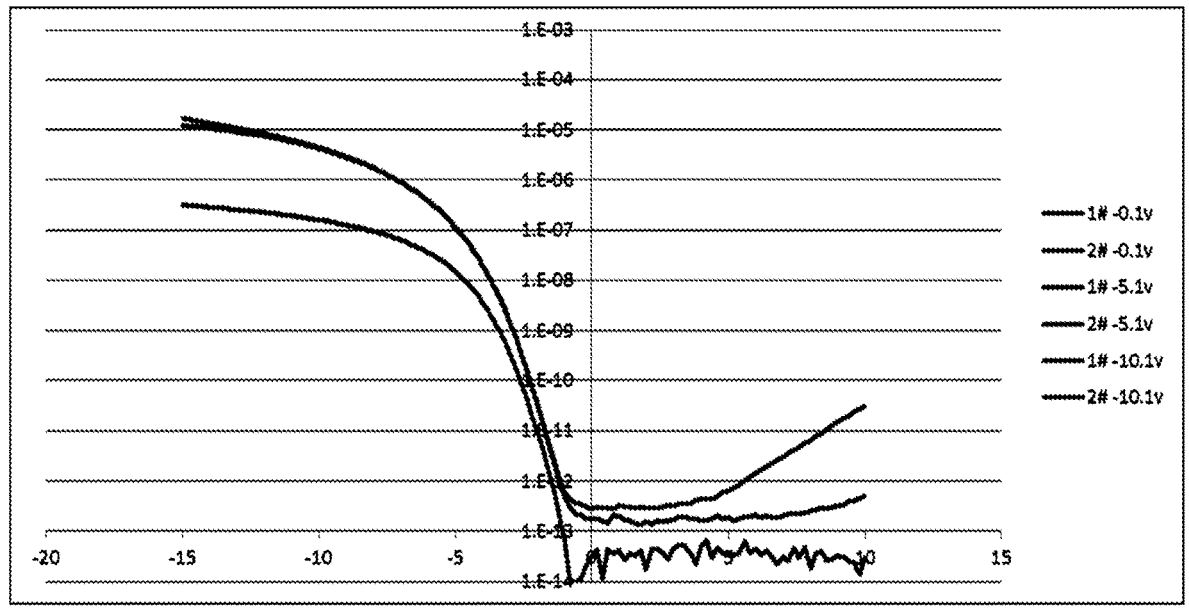
FIG. 2 is a diagram of curves of the subthreshold swing of a drive transistor in the related art.
Figure 3:
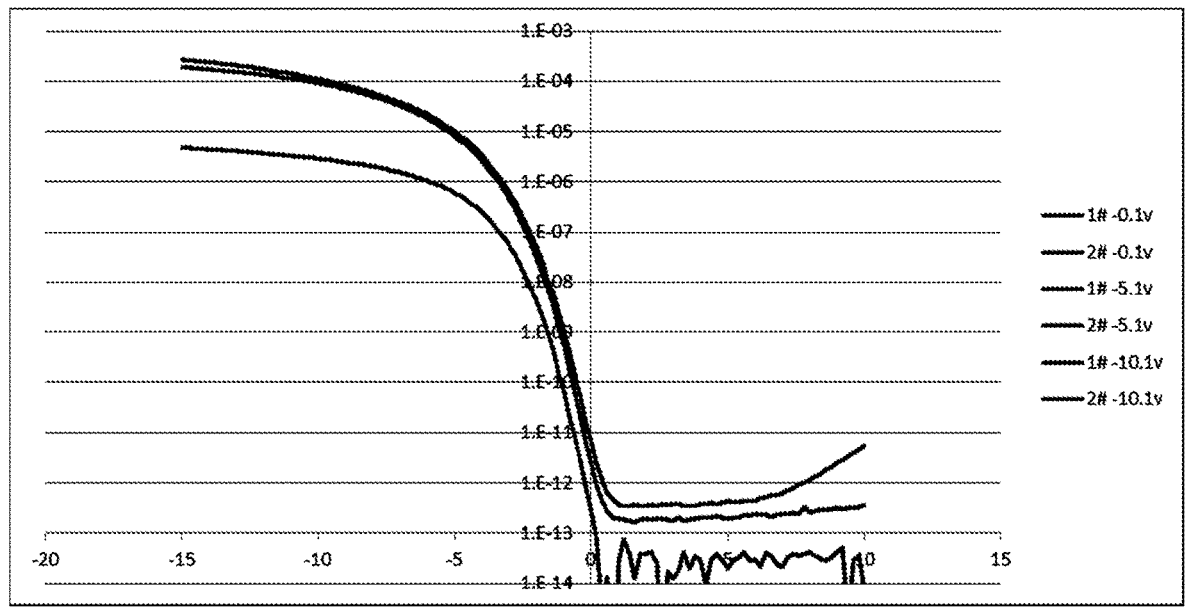
FIG. 3 is a diagram of curves of the subthreshold swing of a switch transistor in the related art.

Since an organic light-emitting device is a current-driving device, an array substrate of organic light-emitting display generally includes both a drive transistor and a switch transistor. FIG. 1 is a structural diagram of an array substrate in the related art. As shown in FIG. 1, the array substrate 10 includes a drive transistor 11 and a switch transistor 12. The drive transistor 11 includes a first active layer 111, the switch transistor 12 includes a second active layer 121, and the first active layer 111 and the second active layer 121 both include silicon. In one embodiment, the first active layer 111 and the second active layer 121 may both include poly-silicon. For transistors that include silicon, such as poly-silicon transistors, it is generally necessary to repair defects in the active layer through a high-temperature process and dehydrogenate the active layer through the high-temperature process to adjust the performance of the transistor. However, the high-temperature process may change the subthreshold swing of the transistor. In one embodiment, FIG. 2 is a diagram of curves of the subthreshold swing of a drive transistor in the related art, and FIG. 3 is a diagram of curves of the subthreshold swing of a switch transistor in the related art. Referring to FIG. 2 and FIG. 3, to alleviate the problem of unevenness in display, the number of high-temperature processes is generally increased to improve the value of the subthreshold swing of the drive transistor 11 (the number of high-temperature processes is positively related to the value of the subthreshold swing). However, for the switch transistor 12, the curve of the subthreshold swing of the switch transistor 12 shifts to the right when the number of high-temperature processes on the switch transistor 12 is the same as the number of high-temperature processes on the drive transistor 11, so that the leakage current of the switch transistor 12 reaches the order of around $10^{-11}$ when the gate-source voltages is equal to zero, and the switch characteristic of the switch transistor 12 becomes poor due to the relative large leakage current. Particularly during the driving with a low frequency, the period of data refreshing is long, so that the long-time current leakage results in poor stability of the switch transistor 12. Therefore, the technology of ensuring the characteristic of the drive transistor while ensuring the small leakage current of the switch transistor has become urgent to be achieved.

Based on the above problem, the embodiments of the present disclosure provide an array substrate. The array substrate includes a base substrate, a pixel circuit, a first-type inorganic layer and a second-type inorganic layer and a first via hole. The pixel circuit is disposed on one side of the base substrate. The pixel circuit includes a first transistor and a second transistor, the first transistor includes a first active layer, the second transistor includes a second active layer, and the first active layer and the second active layer both include silicon. The first-type inorganic layer and the second-type inorganic layer are disposed on one side of the first active layer facing away from the base substrate. The first-type inorganic layer is disposed closer to the first active layer than the second-type inorganic layer. The first via hole at least penetrates through the second-type inorganic layer, and a vertical projection of the first active layer on a plane where the base substrate is located overlaps with a vertical projection of an end of the first via hole closest to the first active layer on the plane where the base substrate is located. In the above solution, a first via hole is additionally disposed in the array substrate. The first via hole penetrates through at least part of inorganic layers above the first active layer, so that a high-temperature process may be performed merely on the first active layer through the first via hole. In this way, hydrogen ions in the first active layer escape through the first via hole, so that concentration of the hydrogen ions in the first active layer is less than concentration of hydrogen ions in the second active layer. Therefore, on the one hand, the first transistor is ensured to have a good performance; on the other hand, the times of high-temperature processes performed on the second transistor are reduced. Thus, the subthreshold swing of the second transistor is ensured to be relatively small, the turn-off characteristic of the second transistor is ensured to be good, the leakage current of the second transistor is small, the overall operating effect of the pixel circuit is improved, and the overall characteristics of the pixel circuit are ensured to be good.

Hereinafter, solutions in the embodiments of the present disclosure will be described clearly and completely in conjunction with drawings in the embodiments of the present disclosure.

Figure 4:
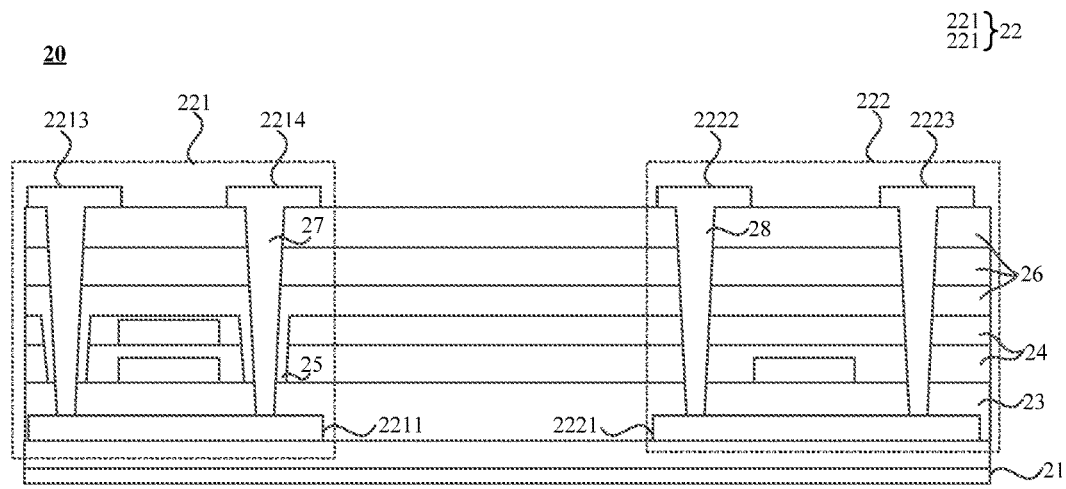
FIG. 4 is a structural diagram of an array substrate according to an embodiment of the present disclosure.

FIG. 4 is a structural diagram of an array substrate according to an embodiment of the present disclosure. As shown in FIG. 4, an array substrate 20 provided by the embodiments of the present disclosure includes a base substrate 21 and a pixel circuit 22. The pixel circuit 22 is disposed on one side of the base substrate 21. The pixel circuit 22 includes a first transistor 221 and a second transistor 222, the first transistor 221 includes a first active layer 2211, the second transistor 222 includes a second active layer 2221, and the first active layer 2211 and the second active layer 2221 both include silicon. In one embodiment, the first active layer 2211 and the second active layer 2221 may both include poly-silicon. The array substrate 20 further includes a first-type inorganic layer 23 and a second-type inorganic layer 24, which are disposed on one side of the first active layer 2211 facing away from the base substrate 21, where the first-type inorganic layer 23 is disposed closer to the first active layer 2211 than the second-type inorganic layer 24. The array substrate 20 further includes a first via hole 25, where the first via hole 25 at least penetrates through the second-type inorganic layer 24, and a vertical projection of the first active layer 2211 on a plane where the base substrate 21 is located overlaps with a vertical projection of an end of the first via hole 25 closest to the first active layer 2211 on the plane where the base substrate 21 is located.

By way of example, for the array substrate provided by the embodiments of the present disclosure, the pixel circuit 22 may include two transistors (2T) or seven transistors (7T). The specific structure of the pixel circuit 22 is not limited in the embodiments of the present disclosure. FIG. 4 merely, by way of example, shows two transistors.

In one embodiment, as shown in FIG. 4, the pixel circuit 22 includes the first transistor 221 and the second transistor 222. The first transistor 221 includes the first active layer 2211, the second transistor 222 includes the second active layer 2221, and the first active layer 2211 and the second active layer 2221 both include silicon. In one embodiment, the first active layer 2211 and the second active layer 2221 may both include poly-silicon. That is, the first active layer 2211 and the second active layer 2221 are poly-silicon active layers, for example, are both low temperature poly-silicon (LTPS) active layers. Further, the array substrate 20 further includes the first-type inorganic layer 23 and the second-type inorganic layer 24, which are disposed on the side of the first active layer 2211 facing away from the base substrate 21, where the first-type inorganic layer 23 is disposed closer to the first active layer 2211 than the second-type inorganic layer 24. The first-type inorganic layer 23 may be one or more inorganic layers, and the second-type inorganic layer 24 may be one or more inorganic layers, which is not limited in the embodiments of the present disclosure. On this basis, the array substrate 20 further includes the first via hole 25, a vertical projection of the first via hole 25 on the plane where the base substrate 21 is located is located within the vertical projection of the first active layer 2211 on the plane where the base substrate 21 is located, and the first via hole 25 at least penetrates through the second-type inorganic layer 24. In this way, high-temperature process may be performed once on the first active layer 2211 through the first via hole 25 and thus hydrogen ions in the first active layer 2211 may escape through the first via hole 25. Since the vertical projection of the first active layer 2211 on the plane where the base substrate 21 is located overlaps with the vertical projection of the end of the first via hole 25 closest to the first active layer 2211 on the plane where the base substrate 21 is located, the process of performing the high-temperature process on the first active layer 2211 through the first via hole 25 does not affect the second active layer 2221, so that concentration of the hydrogen ions in the first active layer 2211 is less than concentration of hydrogen ions in the second active layer 2221. Therefore, dehydrogenation on the first active layer 2211 is ensured while the hydrogen content of the second active layer 2221 remains unchanged, and the performance of the first transistor 221 is ensured to be good while times of high-temperature processes performed on the second transistor 222 are reduced. Thus, the subthreshold swing of the second transistor is ensured to be relatively small, the turn-off characteristic of the second transistor is ensured to be good, the leakage current of the second transistor is small, the overall operating effect of the pixel circuit is improved, and the overall characteristics of the pixel circuit are ensured to be good.

In summary, for the array substrate provided by the embodiments of the present disclosure, the first via hole is additionally disposed in the array substrate. The first via hole penetrates through at least part of inorganic layers above the first active layer, so that the high-temperature process can be performed merely on the first active layer through the first via hole. In this way, the hydrogen ions in the first active layer escape through the first via hole, so that the concentration of the hydrogen ions in the first active layer is less than the concentration of the hydrogen ions in the second active layer. Therefore, on the one hand, the first transistor is ensured to have a good performance; on the other hand, the times of high-temperature processes performed on the second transistor are reduced. Thus, the subthreshold swing of the second transistor is ensured to be relatively small, the turn-off characteristic of the second transistor is ensured to be good, the leakage current of the second transistor is small, the overall operating effect of the pixel circuit is improved, and the overall characteristics of the pixel circuit are ensured to be good.

On the basis of the above embodiments, the first transistor 221 may be a drive transistor, and the second transistor 222 may be a switch transistor. Generally, in a pixel circuit, the switch transistor is a transistor whose gate connected to a scanning signal or a light-emitting control signal, and a transistor other than the switch transistor in the pixel circuit is a drive transistor. The drive transistor is configured in series in a transmission path of the first power supply signal (the PVDD signal), a data signal is written into a gate of the drive transistor, and the gate potential of the drive transistor varies as the data signal is written. The high-temperature process is performed merely on the first active layer in the drive transistor through the first via hole, so that the hydrogen ions in the first active layer escape through the first via hole, and thus the concentration of the hydrogen ions in the first active layer is less than the concentration of the hydrogen ions in the second active layer. Therefore, on the one hand, the drive transistor is ensured to have a good performance; on the other hand, the times of high-temperature processes performed on the switch transistor are reduced. Thus, the subthreshold swing of the switch transistor is ensured to be relatively small, the turn-off characteristic of the switch transistor is ensured to be good, the leakage current is small, the overall operating effect of the pixel circuit is improved, and the overall characteristics of the pixel circuit are ensured to be good.

On the basis of the above embodiments, the first via hole at least penetrating through the second-type inorganic layer may refers to the first via hole only penetrating the second-type inorganic layer or may further refers to the first via hole penetrating the second-type inorganic layer and the first-type inorganic layer at the same time. The above two cases are described respectively below.

Still referring to FIG. 4, the first via hole 25 penetrating through the second-type inorganic layer 24 is taken as an example in FIG. 4 for illustration. As shown in FIG. 4, the first via hole 25 penetrates through the second-type inorganic layer 24, so that in the process of providing the first via hole 25, it is not necessary to etch the surface of the first active layer 2211, the first active layer 2211 can be free from being etched, and thus the integrity of the first active layer 2211 can be ensured to be good. Moreover, even if the first via hole 25 is etched to no reach the first active layer 2211, the hydrogen ions in the first active layer 2211 may also escape through the first via hole 25, so that the normal escape of the hydrogen ions in the first active layer 2211 is ensured on the basis that the first active layer 2211 is free from being etched, and the characteristic of the first transistor 221 is ensured to be good.

Figure 5:
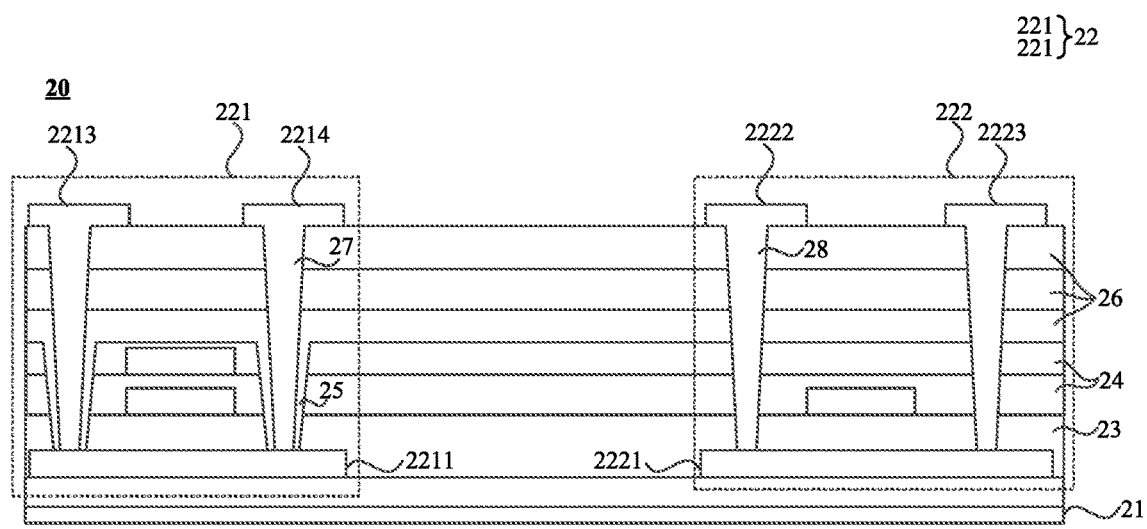
FIG. 5 is a structural diagram of another array substrate according to an embodiment of the present disclosure.

FIG. 5 is a structural diagram of another array substrate according to an embodiment of the present disclosure. The first via hole 25 penetrating through the second-type inorganic layer 24 and the first-type inorganic layer 23 at the same time is taken as an example in FIG. 5 for illustration. As shown in FIG. 5, the first via hole 25 penetrates through the second-type inorganic layer 24 and the first-type inorganic layer 23 at the same time. The first via hole 25 is etched to the surface of the first active layer 2211, so that the hydrogen ions in the first active layer 2211 can escape through the first via hole 25 without obstruction, the escape passage of the hydrogen ions is unobstructed, thus the escape effect of the hydrogen ions is good, and the characteristic of the first transistor 221 is ensured to be excellent.

Still referring to FIG. 4 and FIG. 5, the first transistor 221 further includes a first source electrode 2213 and a first drain electrode 2214, and the second transistor 222 further includes a second source electrode 2222 and a second drain electrode 2223. The first source electrode 2213 and the first drain electrode 2214 are respectively electrically connected to the first active layer 2211 through a first source-drain electrode via hole 27 (a second via hole 27), and the second source electrode 2222 and the second drain electrode 2223 are respectively electrically connected to the second active layer 2221 through a second source-drain electrode via hole 28 (a third via hole 28). Referring to FIG. 4 and FIG. 5, whether the first via hole 25 only penetrates through the second-type inorganic layer 24 or the first via hole 25 penetrates through the second-type inorganic layer 24 and the first-type inorganic layer 23 at the same time, along a direction perpendicular to the base substrate 21, the depth of the first via hole 25 is less than the depth of the first source-drain electrode via hole 27 and the depth of the second source-drain electrode via hole 28, that is, an end of the first via hole 25 facing away from the base substrate 21 is closer to the base substrate 21 and the first active layer 2211 than an end of the source-drain electrode via hole 27 facing away from the base substrate 21 and an end of the second source-drain electrode via hole 28 facing away from the base substrate 21.

Figure 6:
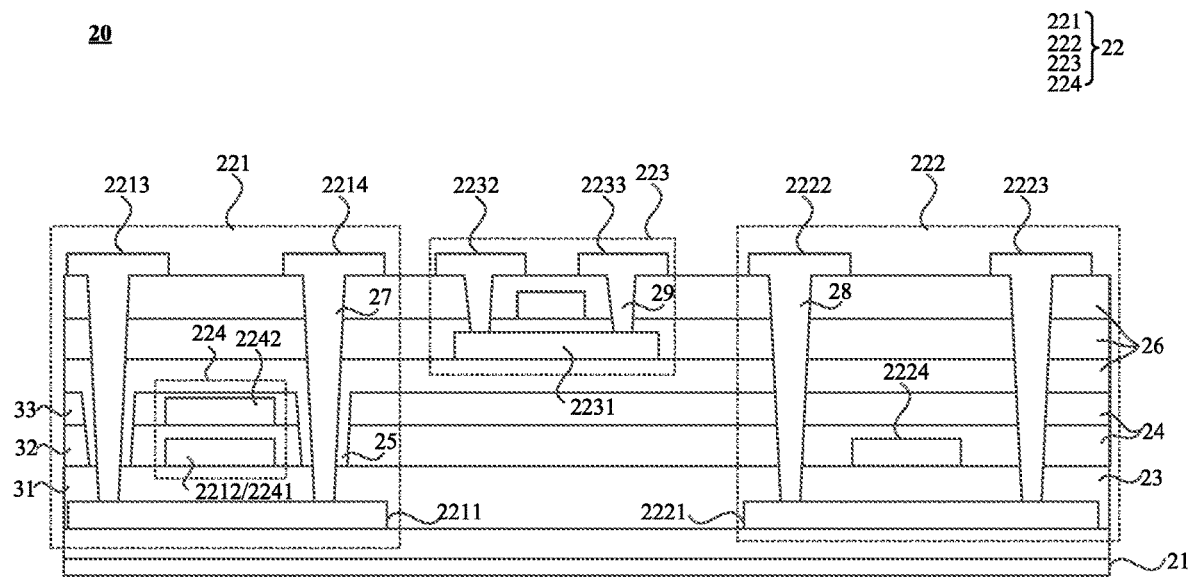
FIG. 6 is a structural diagram of another array substrate according to an embodiment of the present disclosure.
Figure 7:
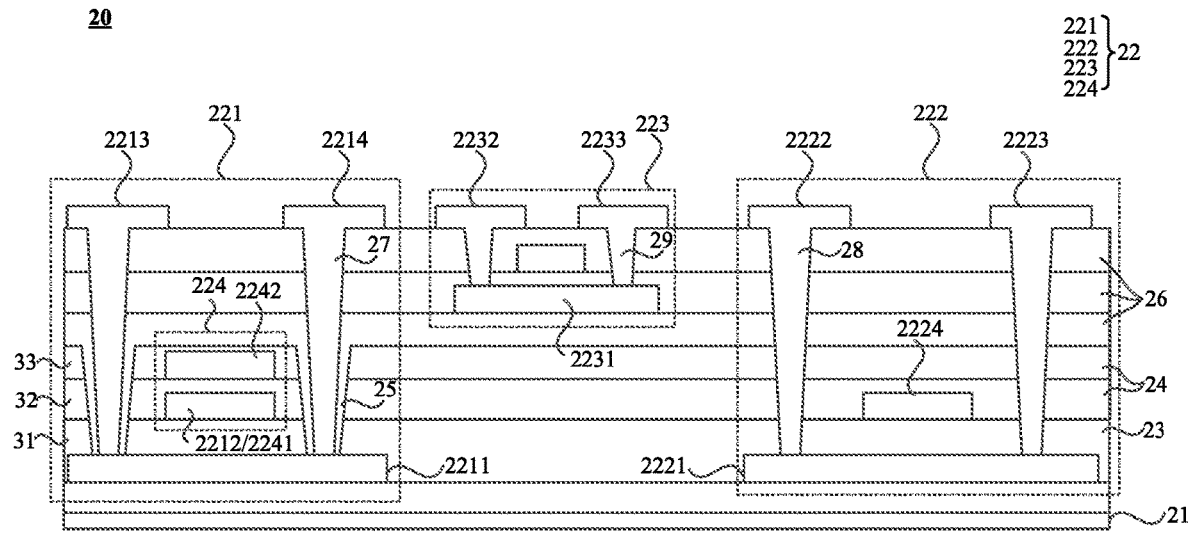
FIG. 7 is a structural diagram of another array substrate according to an embodiment of the present disclosure.

FIG. 6 is a structural diagram of another array substrate according to an embodiment of the present disclosure. FIG. 7 is a structural diagram of another array substrate according to an embodiment of the present disclosure. Referring to FIG. 6 and FIG. 7, the pixel circuit 22 provided by the embodiments of the present disclosure may further include a third transistor 223. The third transistor 223 includes a third active layer 2231, the third active layer 2231 includes an oxide semiconductor, that is, the third active layer 2231 is an oxide semiconductor active layer, and the third active layer 2231 is disposed on the side of the first active layer 2211 facing away from the base substrate 21. The first-type inorganic layer 23 and the second-type inorganic layer 24 are disposed between a film layer where the first active layer 2211 is located and a film layer where the third active layer 2231 is located.

By way of example, as shown in FIG. 6 and FIG. 7, the pixel circuit 22 provided by the embodiments of the present disclosure may further include the third transistor 223. The third transistor 223 includes the third active layer 2231, and the third active layer 2231 may include an oxide semiconductor. That is, the third active layer 2231 is an oxide semiconductor active layer, for example, an indium gallium zinc oxide (IGZO) active layer. The leakage current in the oxide semiconductor transistor is very small, so that the leakage current is ensured to be relatively small during the operating process of the pixel circuit 22, and thus the pixel circuit 22 is ensured to have a good performance.

Further, the oxide semiconductor active layer is relatively sensitive to hydrogen ions, and hydrogen ions will cause the performance degradation of the oxide semiconductor transistor. Therefore, in the embodiments of the present disclosure, the first-type inorganic layer 23 and the second-type inorganic layer 24 being disposed between the film layer where the first active layer 2211 is located and the film layer where the third active layer 2231 is located is achieved, in actual manufacturing processes, through the first via hole 25 at least penetrating through the second inorganic layer 24 being formed firstly, then the high-temperature process being performed on the first active layer 2211 through the first via hole 25, and the third transistor 223 being manufactured on one side of the second inorganic layer 24 facing away from the base substrate 21. In this way, the hydrogen ions escaping from the first active layer 2211 during the high-temperature process will not affect the third active layer 2231, so that the performance of the third transistor 223 can be ensured to be excellent.

In one embodiment, with continued reference to FIG. 6 and FIG. 7, the pixel circuit 22 provided by the embodiments of the present disclosure may further include a capacitor 224. The capacitor 224 includes a first capacitor plate 2241 and a second capacitor plate 2242 which are disposed opposite to each other. The first transistor 221 may further includes a first gate electrode 2212, which is disposed on the side of the first active layer 2211 facing away from the base substrate 21, the first capacitor plate 2241 and the first gate electrode 2212 are disposed in a same layer, and the second capacitor plate 2242 is disposed on one side of the first capacitor plate 2241 facing away from the base substrate 21. The array substrate 20 may further include a first insulating layer 31 disposed between the first active layer 2211 and the first gate electrode 2212, a second insulating layer 32 disposed between the first gate electrode 2212 and the second capacitor plate 2242, and a third insulating layer 33 disposed between the second capacitor plate 2242 and the third active layer 2231. At least one of the first insulating layer 31, the second insulating layer 32 and the third insulating layer 33 is a silicon nitride layer, and the first via hole 25 penetrates through the silicon nitride layer.

By way of example, the pixel circuit 22 may further include the capacitor 224. The capacitor 224 may be used as a storage element to ensure the gate potential of the first transistor 221 to be stable. In one embodiment, the capacitor 224 may include the first capacitor plate 2241 and the second capacitor plate 2242. The first capacitor plate 2241 and the first gate electrode 2212 of the first transistor 221 may be disposed in a same layer, and the second capacitor plate 2242 is disposed on one side of the first electrode gate 2212 facing away from the base substrate 21. The first gate electrode 2212 being also used as the first capacitor plate 2241, taken as an example in FIG. 6 and FIG. 7 for illustration, can ensure that the film layer structure of the array substrate 20 is simple while ensuring that the manufacturing process of the first gate electrode 2212 and the first capacitor plate 2241 is simple.

On this basis, the array substrate 20 may further include the first insulating layer 31 disposed between the first active layer 2211 and the first gate electrode 2212, the second insulating layer 32 disposed between the first gate electrode 2212 and the second capacitor plate 2242, and the third insulating layer 33 disposed between the second capacitor plate 2242 and the third active layer 2231. The first insulating layer 31 may be the above-mentioned first-type inorganic layer 23, and the second insulating layer 32 and the third insulating layer 33 may be the above-mentioned second-type inorganic layer 24; or the first insulating layer 31 and the second insulating layer 32 are the above-mentioned first-type inorganic layer 23, and the third insulating layer 33 is the above-mentioned second-type inorganic layer 24, which is not limited in the embodiments of the present disclosure. In FIG. 6 and FIG. 7, only the case that the first insulating layer 31 is the above-mentioned first-type inorganic layer and the second insulating layer 32 and the third insulating layer 33 are above-mentioned second-type inorganic layer 24 is taken as an example for illustration. Since the silicon nitride layer has a strong blocking effect on the escape of hydrogen ions, when at least one of the first insulating layer 31, the second insulating layer 32 and the third insulating layer 33 is a silicon nitride layer, the first via hole 25 penetrates through the silicon nitride layer, so that the escape passage of hydrogen ions is ensured to be unobstructed, the hydrogen ions in the first active layer 2211 are ensured to escape smoothly, and thus the performance of the first active layer 2211 is ensured to be excellent.

In one embodiment, referring to FIG. 6, the second insulating layer 32 and/or the third insulating layer 33 in FIG. 6 may be a silicon nitride layer, and the first via hole 25 penetrates through the silicon nitride layer. Referring to FIG. 7, at least one of the first insulating layer 31, the second insulating layer 32 and the third insulating layer 33 in FIG. 7 may be the silicon nitride layer, the first via hole 25 penetrates through the silicon nitride layer, so that the escape passage of hydrogen ions is ensured to be unobstructed, and thus the hydrogen ions in the first active layer 2211 are ensured to escape smoothly.

As a feasible implementation, still referring to FIG. 4, FIG. 5, FIG. 6 and FIG. 7, the array substrate 20 provided by the embodiments of the present disclosure may further include a third-type inorganic layer 26, which is disposed on one side of the second-type inorganic layer 24 facing away from the base substrate 21, where the third-type inorganic layer 26 includes a plurality of third inorganic layers, and a third inorganic layer adjacent to the second-type inorganic layer 24 overlaps with the second-type inorganic layer 24 and fills the first via hole 25.

By way of example, after the high-temperature process is performed on the first active layer 2211 through the first via hole 25, the third inorganic layer adjacent to the second-type inorganic layer 24 can fill the first via hole 25, so that no suspended and unfilled region exits in the array substrate 20, and thus the structure of the array substrate 20 is ensured to be stable.

As a feasible implementation, still referring to FIG. 6 and FIG. 7, the array substrate 20 provided by the embodiments of the present disclosure may further include the second via hole 27 and the third via hole 28. The second via hole 27 is the above-mentioned first source-drain electrode via hole 27, and the third via hole 28 is the above-mentioned second source-drain electrode via hole 28. The second via hole 27 and the third via hole 28 both penetrate through the first-type inorganic layer 23, the second-type inorganic layer 24 and the third-type inorganic layer 26. A vertical projection of the second via hole 27 on the plane where the base substrate 21 is located at least partially overlaps with the vertical projection of the first via hole 25 on the base substrate 21, and a vertical projection of the second active layer 2221 on the base substrate 21 overlaps with a vertical projection of an end of the third via hole 28 closest to the second active layer 2221 on the plane where the base substrate 21 is located. The array substrate 20 may further include a fourth via hole 29, where the fourth via hole 29 penetrates through the third-type inorganic layer 26, which is disposed on one side of the third active layer 2231 facing away from the base substrate 21, and a vertical projection of the third active layer 2231 on the base substrate 21 overlaps with a vertical projection of an end of the fourth via hole 29 closest to the third active layer 2231 on the plane where the base substrate 21 is located. The first transistor 221 further includes the first source electrode 2213 and the first drain electrode 2214, the second transistor 222 further includes the second source electrode 2222 and the second drain electrode 2223, and third transistor further includes a third source electrode 2232 and a third drain electrode 2233, and the first source electrode 2213, the first drain electrode 2214, the second source electrode 2222, the second drain electrode 2223, the third source electrode 2232 and the third drain electrode 2233 are disposed in a same layer. The first source electrode 2213 and the first drain electrode 2214 are electrically connected to the first active layer 2211 through the second via hole 27, the second source electrode 2222 and the second drain electrode 2223 are electrically connected to the second active layer 2221 through the third via hole 28, and the third source electrode 2232 and the third drain electrode 2233 are electrically connected to the third active layer 2231 through the fourth via hole 29.

By way of example, still referring to FIG. 6 and FIG. 7, the first transistor 221 further includes the first source electrode 2213 and the first drain electrode 2214, the second transistor 222 further includes the second source electrode 2222 and the second drain electrode 2223, and the third transistor 223 further includes the third source electrode 2232 and the third drain electrode 2233. The first source electrode 2213, the first drain electrode 2214, the second source electrode 2222, the second drain electrode 2223, the third source electrode 2232 and the third drain electrode 2233 are disposed in a same layer, so that the film layer structure of the array substrate 20 is simple. Further, the array substrate 20 provided by the embodiments of the present disclosure may further include the second via hole 27, the third via hole 28 and the fourth via hole 29. The second via hole 27 and the third via hole 28 both penetrate through the first-type inorganic layer 23, the second-type inorganic layer 24 and the third-type inorganic layer 26, and the third via hole 29 penetrates through the third-type inorganic layer 26 above the third active layer 2231, so that the first source electrode 2213 and the first drain electrode 2214 are electrically connected to the first active layer 2211 through the second via hole 27, the second source electrode 2222 and the second drain electrode 2223 are electrically connected to the second active layer 2221 through the third via hole 28, and the third source electrode 2232 and the third drain electrode 2233 are electrically connected to the third active layer 2231 through the fourth via hole 29. Therefore, the complete connection relationship of the first transistor 221, the second transistor 222 and the third transistor 223 is achieved.

On the basis of the above embodiments, still referring to FIG. 6 and FIG. 7, since the first transistor 221 and the second transistor 222 both include poly-silicon active layers, the first active layer 2211 and the second active layer 2221 may be disposed in a same layer, so that the film layer structure of the array substrate 20 is ensured to be simple. Further, the first transistor 221 of the present disclosure may further include the first gate electrode 2212, and the second transistor 222 may further include the second gate electrode 2224. The first gate electrode 2212 and the second gate electrode 2224 may be disposed in a same layer, so that the film layer structure of the array substrate 20 is ensured to be simple.

Figure 8:
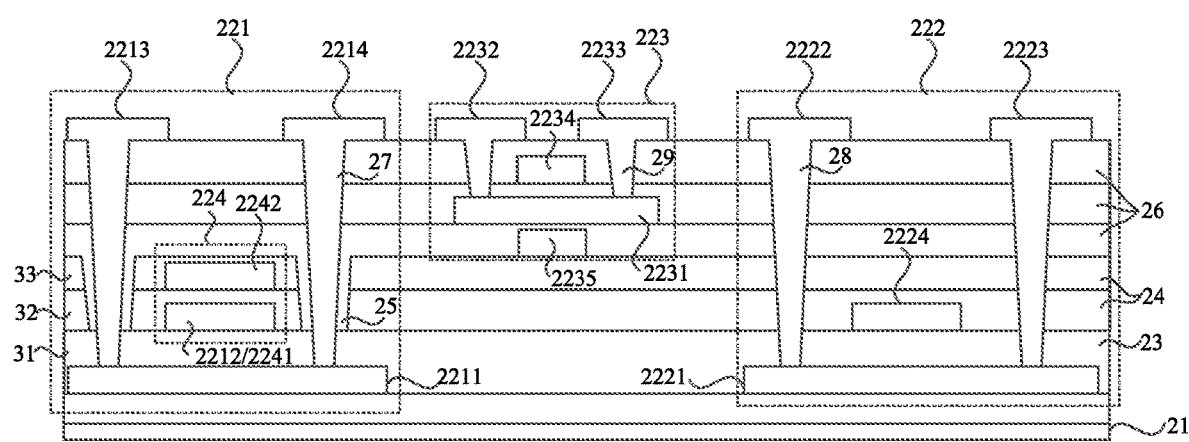
FIG. 8 is a structural diagram of another array substrate according to an embodiment of the present disclosure.

On the basis of the above embodiments, FIG. 8 is a structural diagram of another array substrate according to an embodiment of the present disclosure. As shown in FIG. 8, the third transistor 223 may be a double-gate transistor. For example, the third transistor 223 may include a third gate electrode 2234 disposed on the side of the third active layer 2231 facing away from the base substrate 21 and a fourth gate electrode 2235 disposed on one side of the third active layer 2231 closest to the base substrate 21, that is, the third transistor 223 is a double-gate transistor with a top-gate structure and a bottom-gate structure, so that the performance of the third transistor 223 is ensured to be stable. It should be noted that since the third transistor 223 may be an oxide semiconductor transistor which is generally of a relatively large volume, the third transistor 223 being set as a double-gate transistor with a top gate and a bottom gate stacked facilitates the reduction of the volume of the third transistor and the miniaturization design of the entire pixel circuit.

On the basis of the above embodiments, the first transistor 221 and the second transistor 222 may also be double-gate transistors (not shown). The active layers of the first transistor 221 and the second transistor 222 both include silicon, for example, poly-silicon, and accordingly, the first transistor 221 and the second transistor 222, for example, may be poly-silicon transistors. Since the volume of the poly-silicon transistor is relatively small, when the first transistor 221 and the second transistor 222 are both double-gate structure transistors, the two gates of the first transistor 221 may both be top-gate structures, for example, the two gates of the first transistor 221 are both disposed on the side of the first active layer 2211 facing away from the base substrate 21, and the two gates of the second transistor 222 may both be top-gate structures, for example, the two gates of the second transistor 222 are both disposed on one side of the second active layer 2221 facing away from the base substrate 21. Of course, the two gates of the first transistor 221 may be respectively disposed on two sides of the film layer where the first active layer 2211 is located, the two gates of the second transistor 222 may be respectively disposed on two sides of the film layer where the second active layer 2221 is located, and the two gates of the first transistor 221 and the two gates of the second transistor 222 may be disposed correspondingly in a same layer, so that the performance of the first transistor is ensured to be excellent (such as a relatively small leakage current) while the structure of the array substrate is ensured to be simple. The specific structures of the first transistor 221 and the second transistor 222 are not limited in the embodiments of the present disclosure.

Figure 9:
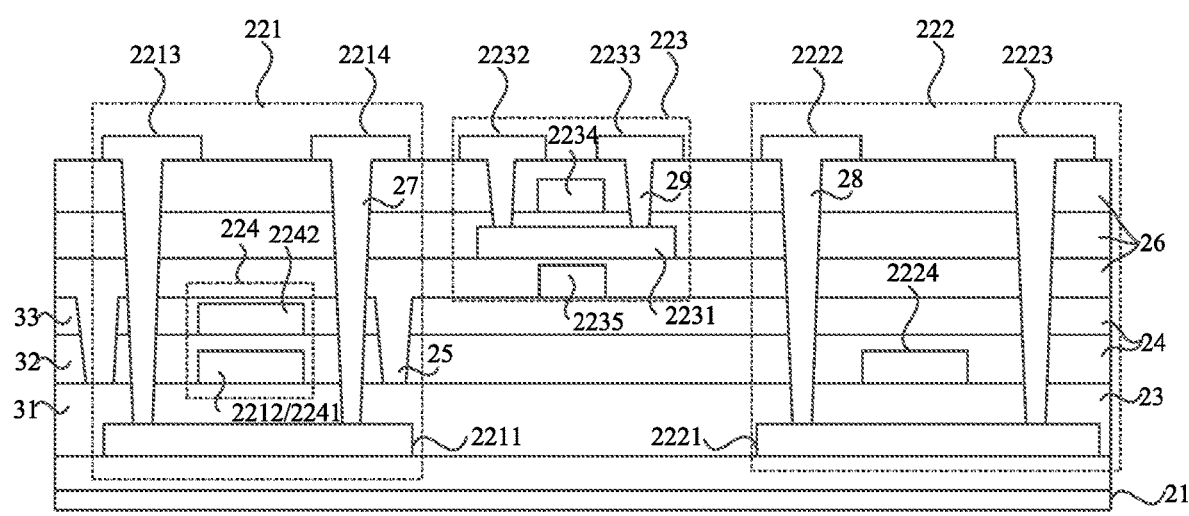
FIG. 9 is a structural diagram of another array substrate according to an embodiment of the present disclosure.
Figure 13:
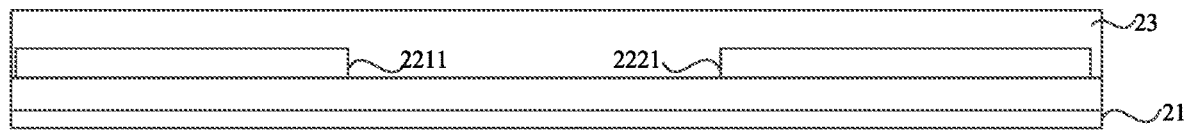

FIG. 9 is a structural diagram of another array substrate according to an embodiment of the present disclosure. As show in FIG. 9, along the direction perpendicular to the base substrate, an end of the first via hole 25 closest to the base substrate 21 does not overlap with an end of the second via hole 27 closest to the base substrate 21. Therefore, the position where the second via hole 27 is disposed is not necessarily limited to the position where the first via hole 25 is disposed, so that the flexibility of the position for disposing the second via hole 27 is high, the complexity of the process is low, and diversified design requirements of the second via hole 27 are satisfied.

Based on the same inventive concept, the embodiments of the present disclosure further provide a manufacturing method of an array substrate, which is used for manufacturing the array substrate of the above embodiments. Referring to FIG. 4, FIG. 5, FIG. 6, FIG. 7 and FIG. 8, the array substrate 20 includes the pixel circuit 22, the pixel circuit 22 includes the first transistor 221 and the second transistor 222, the first transistor 221 includes the first active layer 2211, the second transistor 222 includes the second active layer 2221, and the first active layer 2211 and the second active layer 2221 both include silicon. FIG. 10 is a flowchart of a manufacturing method of an array substrate according to an embodiment of the present disclosure. As shown in FIG. 10, the manufacturing method of an array substrate provided by the embodiments of the present disclosure includes the steps described below.

In step S110, the base substrate is provided.

As shown in FIG. 11, the base substrate 21 may be a flexible substrate or a rigid substrate, which is not limited in the embodiments of the present disclosure. When the base substrate 21 is a flexible substrate, the base substrate 21 may include one flexible layer, such as polyimide (PI), or may include two layers of polyimide (PI), which is not limited in the embodiments of the present disclosure.

In step S120, the first active layer and the second active layer are manufactured on one side of the base substrate.

As shown in FIG. 12, the first active layer 2211 and the second active layer 2221 both include silicon, for example, both include poly-silicon. That is, the first active layer 2211 and the second active layer 2221 are poly-silicon active layers, for example, are low temperature poly-silicon (LTPS) active layers.

In step S130, the first-type inorganic layer is manufactured on the side of the first active layer facing away from the base substrate.

As shown in FIG. 12, the first-type inorganic layer 23 overlaps with the first active layer 2211 and the second active layer 2221, and the first-type inorganic layer 23 may include one or more inorganic layers. In FIG. 12, only the case that the first-type inorganic layer 23 includes one inorganic layer is taken as an example for illustration.

In step S140, a first heating process is performed on the first active layer through the first-type inorganic layer.

Figure 14:
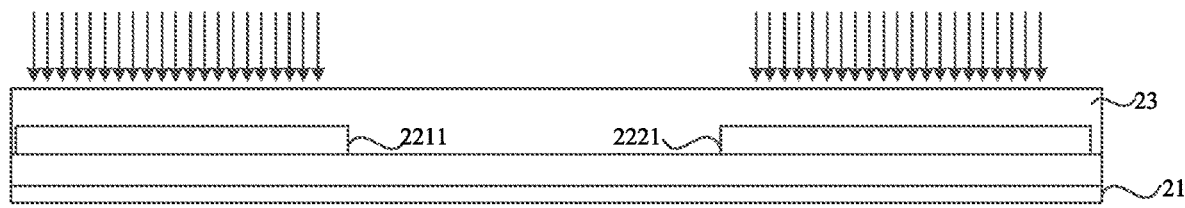

As shown in FIG. 14, the first heating process is performed on the first active layer 2211 and the second layer 2221 through the first-type inorganic layer 23, to activate and repair defects of the first active layer 2211 and the second active layer 2221.

In step S150, the second-type inorganic layer is manufactured on one side of the first-type inorganic layer facing away from the base substrate.

Figure 15:
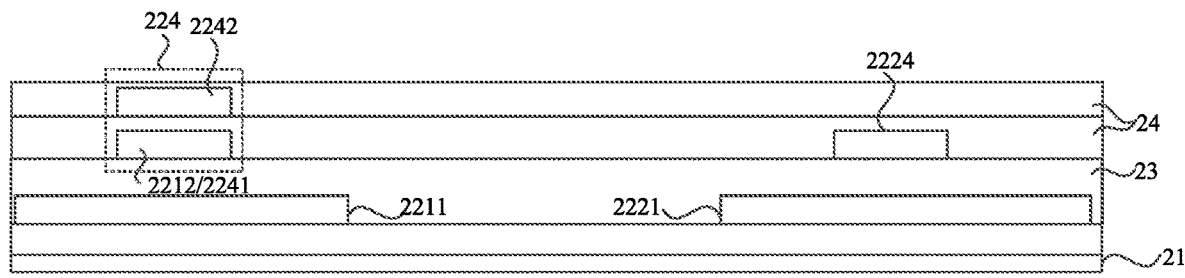

As shown in FIG. 15, the second-type inorganic layer 24 is disposed on the side of the first-type inorganic layer 23 facing away from the base substrate 21, and the second-type inorganic layer 24 overlaps with the first-type inorganic layer 23. Further, the second-type inorganic layer 24 may include one or more inorganic layers, and in FIG. 15, only the case that the second-type inorganic layer 24 includes two inorganic layers is taken as an example for illustration.

Further, as shown in FIG. 15, when the second-type inorganic layer is manufactured, the first gate electrode 2212 of the first transistor 221, the second gate electrode 2224 of the second transistor 222 and a capacitor structure 224 may be manufactured simultaneously. The capacitor structure 224 includes the first capacitor plate 2241 and the second capacitor plate 2242, and the first capacitor plate 2241 and the first gate electrode 2212 are disposed in a same layer. In FIG. 15, the first gate electrode 2212 being also used as the first capacitor plate 2341 is taken as an example for illustration.

In step S160, the first via hole at least penetrating through the second-type inorganic layer is provided, and the vertical projection of the first active layer on the plane where the base substrate is located overlaps with the vertical projection of the end of the first via hole closest to the first active layer on the plane where the base substrate is located.

Figure 16:
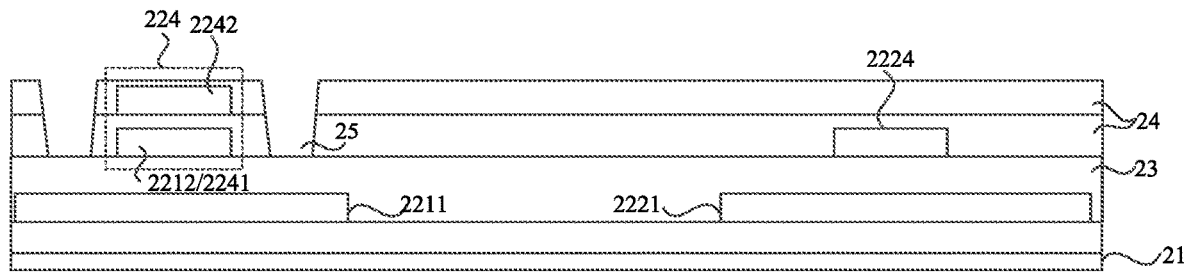

As shown in FIG. 16, the first via hole 25 is provided above the region corresponding to the first active layer 2211, that is, the vertical projection of the first active layer 2211 on the plane where the base substrate 21 is located overlaps with the vertical projection of the end of the first via hole 25 closest to the first active layer 2211 on the plane where the base substrate 21 is located. Further, the first via hole 25 at least penetrates through the second-type inorganic layer 24, and in FIG. 16, only the case that the first via hole 25 penetrates through the second-type inorganic layer 24 is taken as an example for illustration.

In step S170, a second heating process is performed on the first active layer through the first via hole so that the concentration of the hydrogen ions in the first active layer is less than the concentration of the hydrogen ions in the second active layer.

Figure 17:
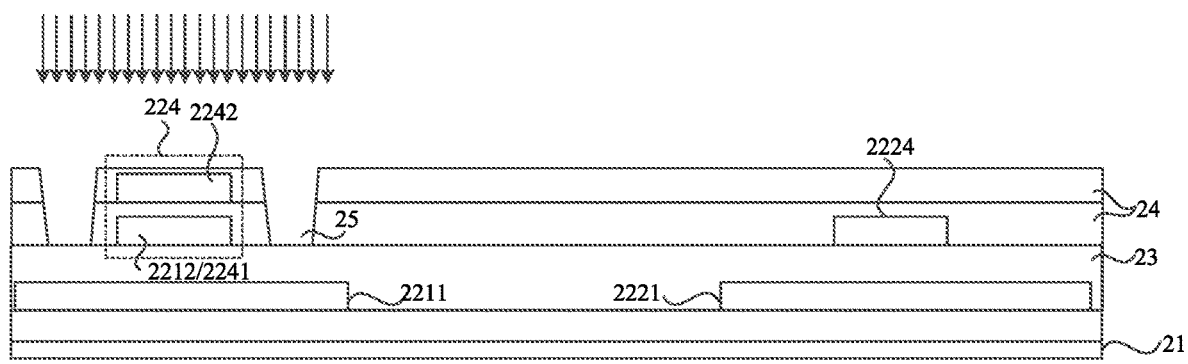

As shown in FIG. 17, the second heating process is performed on the first active layer 2211 through the first via hole 25, so that the hydrogen ions in the first active layer 2211 escape through the first via hole 25. Therefore, the concentration of the hydrogen ions in the first active layer 2211 is ensured to be less than the concentration of the hydrogen ions in the second active layer 2221, so that on the one hand, the performance of the first transistor 221 is ensured to be good, on the other hand, the subthreshold swing of the second transistor 222 is ensured to be relatively small, and the turn-off characteristic of the second transistor 222 is ensured to be good.

In summary, according to the manufacturing method of an array substrate provided by the embodiments of the present disclosure, firstly, high-temperature process is performed once on the first active layer and the second active layer to eliminate the defects of the first active layer and the second active layer; then, the first via hole is provided at least in the second-type inorganic layer, and the first via hole penetrates through at least part of the inorganic layers above the first active layer; and a second high-temperature process is performed on the first active layer through the first via hole, so that the hydrogen ions in the first active layer escape through the first via hole, and thus the concentration of the hydrogen ions in the first active layer is less than the concentration of the hydrogen ions in the second active layer. Therefore, on the one hand, the performance of the first transistor is ensured to be good; on the other hand, the times of high-temperature processes performed on the second transistor are reduced. Thus, the subthreshold swing of the second transistor is ensured to be relatively small, the turn-off characteristic of the second transistor is ensured to be good, the leakage current of the second transistor is small, the overall operating effect of the pixel circuit is improved, and the overall characteristics of the pixel circuit are ensured to be good.

On the basis of the above embodiments, the step of the first via hole being provided and at least penetrating through the second-type inorganic layer includes: the first via hole is provided, and the first via hole penetrates through the second-type inorganic layer.

By way of example, as shown in FIG. 16, the first via hole 25 penetrates through the second-type inorganic layer 24, so that in the process of providing the first via hole 25, it is not necessary to etch the surface of the first active layer 2211, the first active layer 2211 can be free from being etched, and thus the integrity of the first active layer 2211 can be ensured to be good. Moreover, even if the first via hole 25 is not etched to the first active layer 2211, the hydrogen ions in the first active layer 2211 can also escape through the first via hole 25, so that the normal escape of the hydrogen ions is ensured on the basis that the first active layer 2211 is free from being etched, and the characteristic of the first transistor 221 is ensured to be good.

On the basis of the above embodiments, the step of the first via hole being provided and at least penetrating through the second-type inorganic layer includes: the first via hole is provided, and the first via hole penetrates through the second-type inorganic layer and the first-type inorganic layer.

By way of example, the first via hole penetrates through the second-type inorganic layer and the first-type inorganic layer. The first via hole is etched to the surface of the first active layer, so that the hydrogen ions in the first active layer can escape through the first via hole without obstruction, the escape passage of the hydrogen ions is unobstructed, thus the escape effect of the hydrogen ions is good, and the characteristic of the first transistor is ensured to be excellent.

Figure 18:
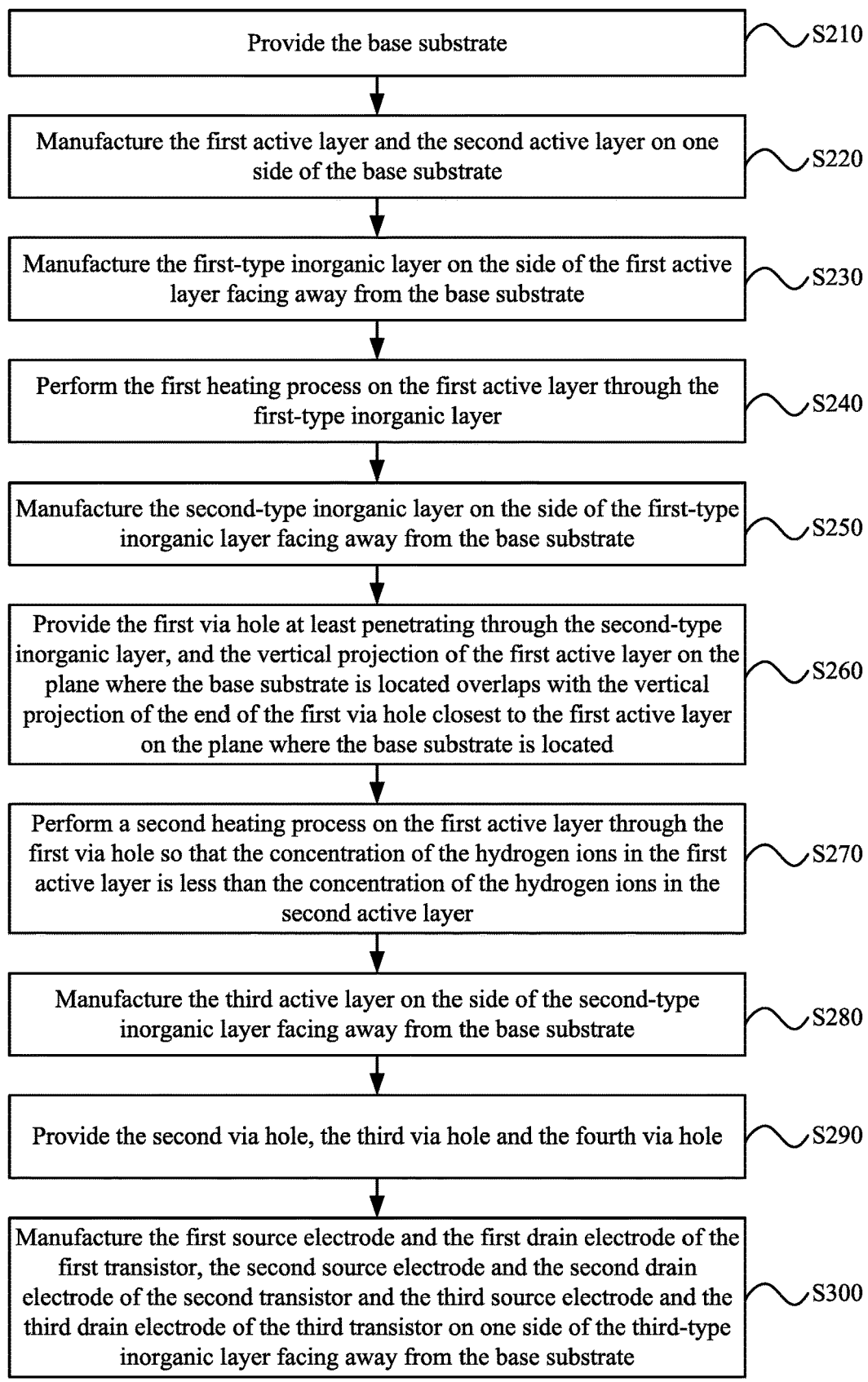
FIG. 18 is a flowchart of another manufacturing method of an array substrate according to an embodiment of the present disclosure.

On the basis of the above embodiments, the pixel circuit further includes the third transistor. The third transistor includes the third active layer, and the third active layer includes an oxide semiconductor, that is, the third active layer is an oxide semiconductor active layer. Correspondingly, FIG. 18 is a flowchart of a manufacturing method of another array substrate according to an embodiment of the present disclosure. As shown in FIG. 18, the manufacturing method of an array substrate provided by the embodiments of the present disclosure includes the steps described below.

In step S210, the base substrate is provided.

Continued reference is made to FIG. 11.

In step S220, the first active layer and the second active layer are manufactured on one side of the base substrate.

Continued reference is made to FIG. 12.

In step S230, the first-type inorganic layer is manufactured on the side of the first active layer facing away from the base substrate.

Continued reference is made to FIG. 12.

In step S240, the first heating process is performed on the first active layer through the first-type inorganic layer.

Continued reference is made to FIG. 14.

In step S250, the second-type inorganic layer is manufactured on the side of the first-type inorganic layer facing away from the base substrate.

Continued reference is made to FIG. 15.

In step S260, the first via hole at least penetrating through the second-type inorganic layer is provided, and the vertical projection of the first active layer on the plane where the base substrate is located overlaps with the vertical projection of the end of the first via hole closest to the first active layer on the plane where the base substrate is located.

Continued reference is made to FIG. 16.

In step S270, a second heating process is performed on the first active layer through the first via hole so that the concentration of the hydrogen ions in the first active layer is less than the concentration of the hydrogen ions in the second active layer.

Continued reference is made to FIG. 17.

In step S280, the third active layer is manufactured on the side of the second-type inorganic layer facing away from the base substrate.

By way of example, before, during, or after the manufacturing of the third active layer, the third-type inorganic layer is manufactured on the side of the second-type inorganic layer facing away from the base substrate. The third-type inorganic layer includes a plurality of third inorganic layers, and the third inorganic layer adjacent to the second-type inorganic layer overlaps with the second-type inorganic layer and fills the first via hole.

In the following, the third-type inorganic layer including a plurality of third inorganic layers and the third active layer being manufactured while a plurality of third inorganic layers being manufactured is taken as an example for illustration.

Figure 19:
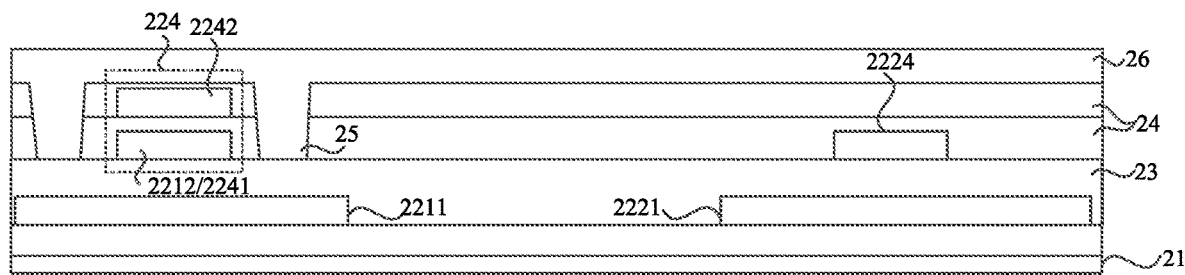
FIG. 19 to FIG. 23 are diagrams illustrating manufacturing processes corresponding to the manufacturing method provided in FIG. 18.

As shown in FIG. 19, one third inorganic layer is manufactured on the side of the second-type inorganic layer 24 facing away from the base substrate 21, and the third inorganic layer fills the first via hole 25. The third inorganic layer adjacent to the second-type inorganic layer 24 fills the first via hole 25, so that no suspended and unfilled region exits in the array substrate 20, and thus the structure of the array substrate 20 is ensured to be stable.

Figure 20:
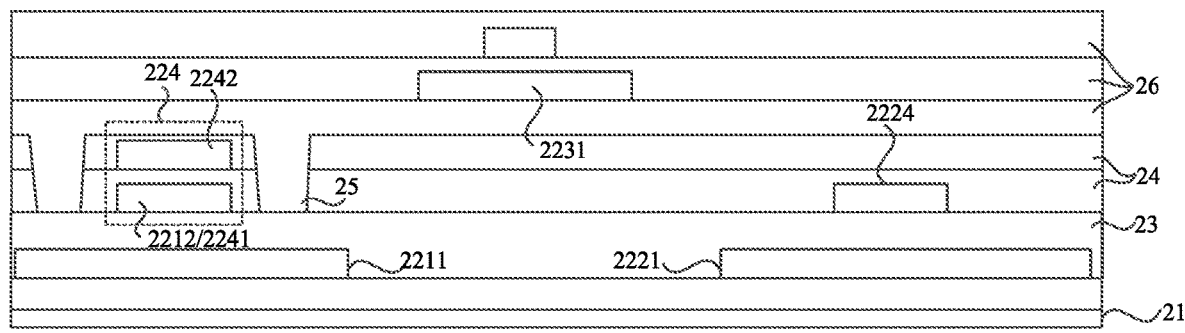

As shown in FIG. 20, the third active layer 2231 is manufactured on one side of the third inorganic layer facing away from the base substrate 21. The third active layer 2231 may include an oxide semiconductor, that is, the third active layer 2231 is an oxide semiconductor active layer, for example, an indium gallium zinc oxide (IGZO) active layer. The leakage current in the oxide semiconductor transistor is very small, so that the leakage current is ensured to be relatively small during the working process of the pixel circuit 22, and thus the performance of the pixel circuit 22 is ensured to be good.

In step S290, the second via hole, the third via hole and the fourth via hole are provided.

Figure 21:
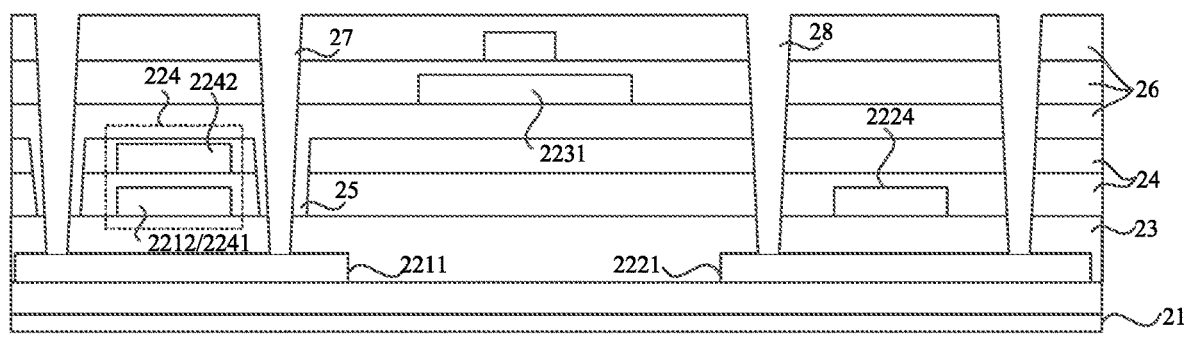

As shown in FIG. 21, the second via hole 27 and the third via hole 28 both penetrate through the first-type inorganic layer 23, the second-type inorganic layer 24 and the third-type inorganic layer 26. The vertical projection of the second via hole 27 on the plane where the base substrate 21 is located at least partially overlaps with the vertical projection of the first via hole 25 on the base substrate 21, and the vertical projection of the second active layer 2221 on the base substrate 21 overlaps with the vertical projection of the end of the third via hole 28 closest to the second active layer 2221 on the plane where the base substrate 21 is located. In one embodiment, the second via hole 27 and the third via hole 28 may be provided simultaneously by a same mask process.

Figure 22:
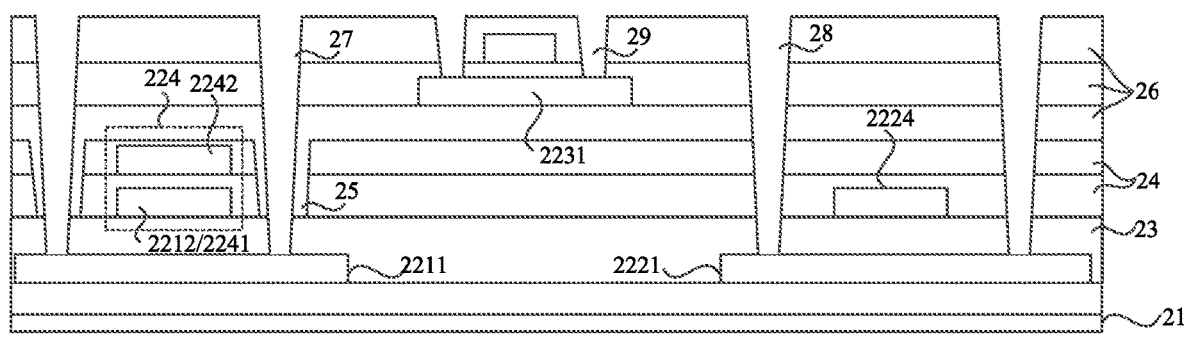

As shown in FIG. 22, the fourth via hole 29 penetrates through the third-type inorganic layer 26, which is disposed on the side of the third active layer 2231 facing away from the base substrate 21, and the vertical projection of the third active layer 2231 on the base substrate 21 overlaps with the vertical projection of the end of the fourth via hole 29 closest to the third active layer 2231 on the plane where the base substrate 21 is located.

It should be noted that the sequence of providing the second via hole, the third via hole and the fourth via hole is not limited in the embodiments of the present disclosure. The fourth via hole may be provided after the second via hole and the third via hole are provided, or the second via hole and the third via hole may be provided after the fourth via hole is provided.

In step S300, the first source electrode and the first drain electrode of the first transistor, the second source electrode and the second drain electrode of the second transistor and the third source electrode and the third drain electrode of the third transistor are manufactured on one side of the third-type inorganic layer facing away from the base substrate.

Figure 23:
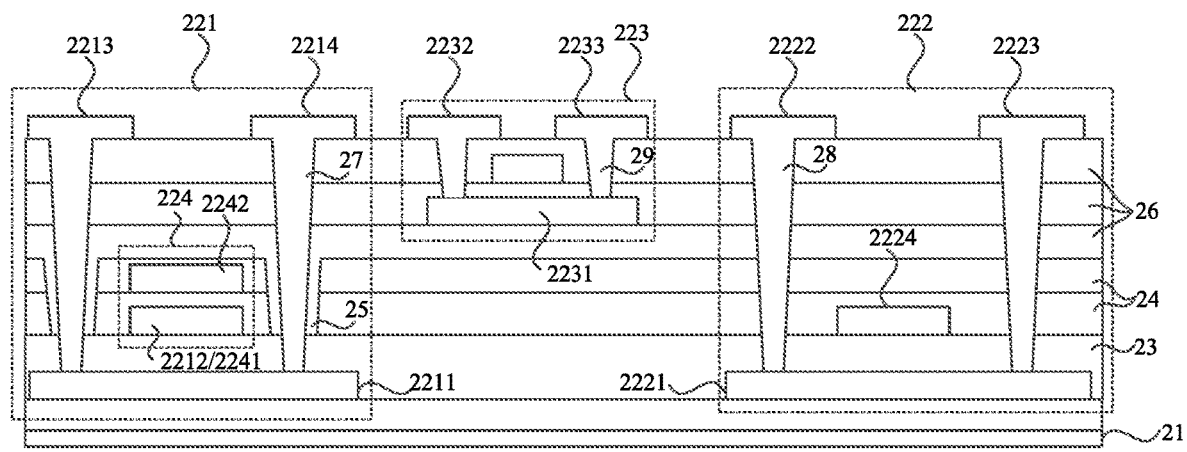

As shown in FIG. 23, the first source electrode 2213 and the first drain electrode 2214 are electrically connected to the first active layer 2211 through the second via hole 27, the second source electrode 2222 and the second drain electrode 2223 are electrically connected to the second active layer 2221 through the third via hole 28, and the third source electrode 2232 and the third drain electrode 2233 are electrically connected to the third active layer 2231 through the fourth via hole 29. Therefore, the complete connection relationship of the first transistor 221, the second transistor 222 and the third transistor 223 is achieved.

On the basis of the above embodiments, the step of manufacturing the first active layer and the second active layer on one side of the base substrate may include the step described below.

The first active layer 2211 and the second active layer 2221 are manufactured on one side of the base substrate 21 by a same mask process, and the first active layer 2211 and the second active layer 2221 are disposed in a same layer, so that the manufacturing process of the first active layer 2211 and the second active layer 2221 is ensured to be simple.

Further, the manufacturing method may further include the step described below.

The first gate electrode is manufactured on the side of the first active layer facing away from the base substrate and the second gate electrode is manufactured on the side of the second active layer facing away from the base substrate by a same mask process, and the first gate electrode and the second gate electrode are disposed in a same layer.

With continued reference to FIG. 15, the first gate electrode 2212 and the second gate electrode 2224 are manufactured by a same mask process, and the first gate electrode 2212 and the second gate electrode 2224 may be disposed in a same layer, so that the film layer structure of the array substrate 20 is ensured to be simple.

Based on the same inventive concept, the embodiments of the present disclosure further provide a display panel. The display panel includes the array substrate according to any one of the above embodiments, and therefore the display panel also has the beneficial effects of the array substrate according to the above implementations. The same content may be understood by referring to the above description of the array substrate and will not be repeated below.

Figure 24:
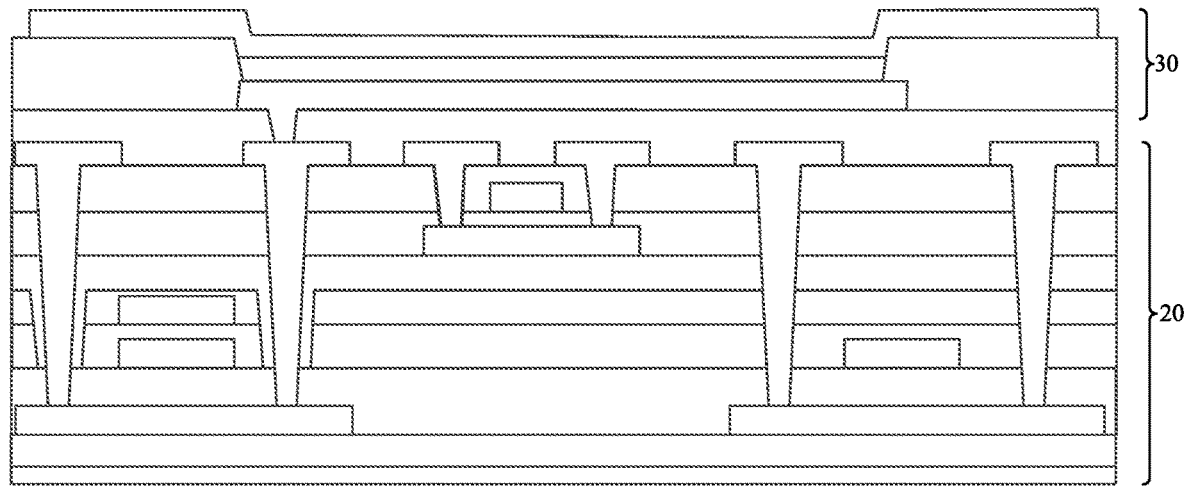
FIG. 24 is a structural diagram of a display panel according to an embodiment of the present disclosure.

By way of example, the display panel 40 may be an organic light-emitting diode (OLED) display panel. As shown in FIG. 24, the OLED display panel 40 includes the array substrate 20 and an organic light-emitting diode 30. Further, the display panel may further be a micro light-emitting diode display panel or other types of display panels, which is not limited by the embodiments of the present disclosure.

Based on the same inventive concept, the embodiments of the present disclosure further provide a display device. The display device includes the display panel according to any one of the above implementations. By way of example, referring to FIG. 25, the display device 50 includes the display panel 40. Therefore, the display device also has the beneficial effects of the display panel and the array substrate according to the above implementations. The same content may be understood by referring to the above description of the display panel and the array substrate and will not be repeated below.

Figure 25:
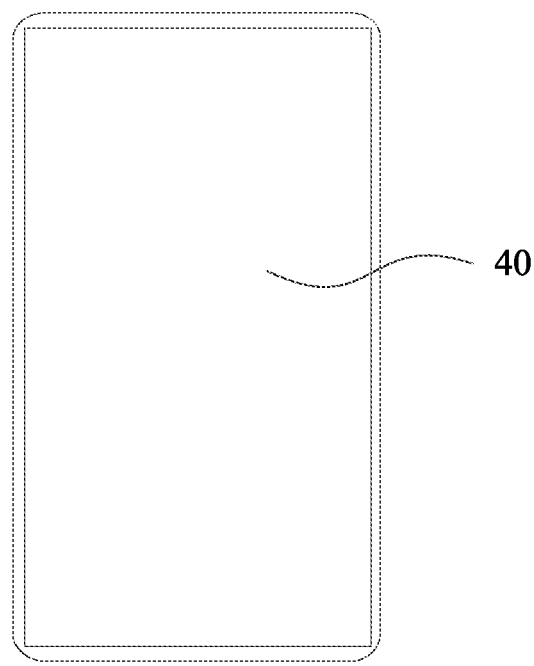
FIG. 25 is a structural diagram of a display device according to an embodiment of the present disclosure.

The display device 50 provided by the embodiments of the present disclosure may be the mobile phone shown in FIG. 25 or any electronic product with a display function including but not limited to: a television, a notebook computer, a desktop display, a tablet computer, a digital camera, a smart bracelet, a pair of smart glasses, a vehicle-mounted display, industrial control equipment, a medical display screen, a touch interactive terminal, etc., which is not particularly limited by the embodiments of the present disclosure.

What is claimed is:

1. An array substrate, comprising:
    a base substrate;
    a pixel circuit, which is disposed on one side of the base substrate, wherein the pixel circuit comprises a first transistor and a second transistor, the first transistor comprises a first active layer, the second transistor comprises a second active layer, and the first active layer and the second active layer both comprise silicon;
    a first type inorganic layer and a second type inorganic layer, which are disposed on one side of the first active layer facing away from the base substrate, wherein the first type inorganic layer is disposed closer to the first active layer than the second type inorganic layer; and
    a first via hole, wherein the first via hole at least penetrates through the second type inorganic layer, and a vertical projection of the first active layer on a plane where the base substrate is located overlaps with a vertical projection of an end of the first via hole closest to the first active layer on the plane where the base substrate is located; wherein
    concentration of hydrogen ions in the first active layer is less than concentration of hydrogen ions in the second active layer;
    the first transistor further comprises a first source electrode and a first drain electrode, and the first source electrode and the first drain electrode are respectively electrically connected to the first active layer through a second via hole; and
    along a direction perpendicular to the base substrate, an end of the first via hole facing away from the base substrate is closer to the base substrate than an end of the second via hole facing away from the base substrate.

2. The array substrate according to claim 1, wherein the first transistor is a drive transistor, and the second transistor is a switch transistor.

3. The array substrate according to claim 1, wherein the first via hole penetrates through the second type inorganic layer.

4. The array substrate according to claim 1, wherein the first via hole penetrates through the first type inorganic layer and the second type inorganic layer.

5. The array substrate according to claim 1, wherein the pixel circuit further comprises a capacitor, and the capacitor comprises a first capacitor plate and a second capacitor plate which are disposed opposite to each other;
    the first transistor further comprises a first gate electrode, which is disposed on the side of the first active layer facing away from the base substrate, the first capacitor plate and the first gate electrode are disposed in a same layer, and the second capacitor plate is disposed on one side of the first capacitor plate facing away from the base substrate;
    wherein the array substrate further comprises: a first insulating layer disposed between the first active layer and the first gate electrode, and a second insulating layer disposed between the first gate electrode and the second capacitor plate, wherein
    at least one of the first insulating layer and the second insulating layer is a silicon nitride layer, and the first via hole penetrates through the silicon nitride layer.

6. The array substrate according to claim 1, further comprising: a third type inorganic layer, which is disposed on one side of the second type inorganic layer facing away from the base substrate, wherein the third type inorganic layer comprises a plurality of third inorganic layers, and a third inorganic layer adjacent to the second type inorganic layer overlaps with the second type inorganic layer and fills the first via hole.

7. The array substrate according to claim 6, further comprising: a second via hole and a third via hole, wherein the second via hole and the third via hole both penetrate through the first type inorganic layer, the second type inorganic layer and the third type inorganic layer; a vertical projection of the second via hole on the plane where the base substrate is located at least partially overlaps with a vertical projection of the first via hole on the base substrate, and a vertical projection of the second active layer on the base substrate overlaps with a vertical projection of an end of the third via hole closest to the second active layer on the plane where the base substrate is located; and
    wherein
    the first transistor further comprises a first source electrode and a first drain electrode, the second transistor further comprises a second source electrode and a second drain electrode, the first source electrode, the first drain electrode, the second source electrode and the second drain electrode are disposed in a same layer; and
    the first source electrode and the first drain electrode are electrically connected to the first active layer through the second via hole, and the second source electrode and the second drain electrode are electrically connected to the second active layer through the third via hole.

8. The array substrate according to claim 1, wherein the first transistor further comprises a first gate electrode, which is disposed on one side of the first active layer;

the second transistor further comprises a second gate electrode, which is disposed on one side of the second active layer facing away from the base substrate; and
the second active layer and the first active layer are disposed in a same layer, and the second gate electrode and the first gate electrode are disposed in a same layer.

9. The array substrate according to claim 1, wherein along the direction perpendicular to the base substrate, an end of the first via hole closest to the base substrate does not overlap with an end of the second via hole closest to the base substrate.

10. A manufacturing method of an array substrate, which is used for manufacturing the array substrate according to claim 1, wherein the array substrate comprises the pixel circuit, the pixel circuit comprises the first transistor and the second transistor, the first transistor comprises the first active layer, the second transistor comprises the second active layer, and the first active layer and the second active layer both comprise silicon;
the method comprises:
providing the base substrate;
manufacturing the first active layer and the second active layer on one side of the base substrate;
manufacturing the first type inorganic layer on the side of the first active layer facing away from the base substrate;
performing a first heating process on the first active layer through the first type inorganic layer;
manufacturing the second type inorganic layer on the side of the first type inorganic layer facing away from the base substrate;
providing the first via hole at least penetrating through the second type inorganic layer, and the vertical projection of the first active layer on the plane where the base substrate is located overlaps with the vertical projection of the end of the first via hole closest to the first active layer on the plane where the base substrate is located; and
performing a second heating process on the first active layer through the first via hole so that the concentration of the hydrogen ions in the first active layer is less than the concentration of the hydrogen ions in the second active layer.

11. The manufacturing method according to claim 10, wherein the providing the first via hole at least penetrating through the second type inorganic layer comprises:
providing the first via hole, wherein the first via hole penetrates through the second type inorganic layer.

12. The manufacturing method according to claim 10, wherein the providing the first via hole at least penetrating through the second type inorganic layer comprising:
providing the first via hole, wherein the first via hole penetrates through the second type inorganic layer and the first type inorganic layer.

13. The manufacturing method according to claim 10, further comprising:
manufacturing a third type inorganic layer on the side of the second type inorganic layer facing away from the base substrate, wherein the third type inorganic layer comprises a plurality of third inorganic layers, and a third inorganic layer adjacent to the second type inorganic layer overlaps with the second type inorganic layer and fills the first via hole.

14. The manufacturing according to claim 13, further comprising:
providing a second via hole and a third via hole, wherein the second via hole and the third via hole both penetrate through the first type inorganic layer, the second type inorganic layer and the third type inorganic layer, a vertical projection of the second via hole on the plane where the base substrate is located at least partially overlaps with a vertical projection of the first via hole on the base substrate, and a vertical projection of the second active layer on the base substrate overlaps with a vertical projection of an end of the third via hole closest to the second active layer on the plane where the base substrate is located;
and
manufacturing a first source electrode and a first drain electrode of the first transistor, and a second source electrode and a second drain electrode of the second transistor on one side of the third type inorganic layer facing away from the base substrate, wherein the first source electrode and the first drain electrode are electrically connected to the first active layer through the second via hole, and the second source electrode and the second drain electrode are electrically connected to the second active layer through the third via hole.

15. The manufacturing method according to claim 10, wherein the manufacturing the first active layer and the second active layer on the side of the base substrate comprises:
manufacturing the first active layer and the second active layer on the side of the base substrate by adopting a same mask process, wherein the first active layer and the second active layer are disposed in a same layer;
the method further comprises:
manufacturing a first gate electrode on the side of the first active layer facing away from the base substrate and a second gate electrode on one side of the second active layer facing away from the base substrate by adopting a same mask process, wherein the first gate electrode and the second gate electrode are disposed in a same layer.

16. A display panel, comprising:
an array substrate, wherein the array substrate comprises:
a base substrate;
a pixel circuit, which is disposed on one side of the base substrate, wherein the pixel circuit comprises a first transistor and a second transistor, the first transistor comprises a first active layer, the second transistor comprises a second active layer, and the first active layer and the second active layer both comprise silicon;
a first type inorganic layer and a second type inorganic layer, which are disposed on one side of the first active layer facing away from the base substrate, wherein the first type inorganic layer is disposed closer to the first active layer than the second type inorganic layer; and
a first via hole, wherein the first via hole at least penetrates through the second type inorganic layer, and a vertical projection of the first active layer on a plane where the base substrate is located overlaps with a vertical projection of an end of the first via hole closest to the first active layer on the plane where the base substrate is located; wherein
concentration of hydrogen ions in the first active layer is less than concentration of hydrogen ions in the second active layer;
the first transistor further comprises a first source electrode and a first drain electrode, and the first source electrode and the first drain electrode are respectively electrically connected to the first active layer through a second via hole; and along a direction perpendicular to the base substrate, an end of the first via hole facing away from the base substrate is closer to the base substrate than an end of the second via hole facing away from the base substrate.

17. A display device, comprising:
a display panel, wherein the display panel comprises an array substrate, and the array substrate comprises: a base substrate;
a pixel circuit, which is disposed on one side of the base substrate, wherein the pixel circuit comprises a first transistor and a second transistor, the first transistor comprises a first active layer, the second transistor comprises a second active layer, and the first active layer and the second active layer both comprise silicon;
a first type inorganic layer and a second type inorganic layer, which are disposed on one side of the first active layer facing away from the base substrate, wherein the first type inorganic layer is disposed closer to the first active layer than the second type inorganic layer; and
a first via hole, wherein the first via hole at least penetrates through the second type inorganic layer, and a vertical projection of the first active layer on a plane where the base substrate is located overlaps with a vertical projection of an end of the first via hole closest to the first active layer on the plane where the base substrate is located; wherein
concentration of hydrogen ions in the first active layer is less than concentration of hydrogen ions in the second active layer;
the first transistor further comprises a first source electrode and a first drain electrode, and the first source electrode and the first drain electrode are respectively electrically connected to the first active layer through a second via hole; and
along a direction perpendicular to the base substrate, an end of the first via hole facing away from the base substrate is closer to the base substrate than an end of the second via hole facing away from the base substrate.

* * * * *